United States Patent [19]
Hara et al.

[11] Patent Number: 4,794,609
[45] Date of Patent: Dec. 27, 1988

[54] SEMICONDUCTOR LASER PROVIDED WITH A PLURALITY OF LASERS IN THE FORM OF AN ARRAY

[75] Inventors: Toshitami Hara, Tokyo; Seiichi Miyazawa, Kawasaki; Hidetoshi Nojiri, Matsudo; Akira Shimizu, Tokyo; Yoshinobu Sekiguchi, Kawasaki; Isao Hakamada, Yokohama, all of Japan

[73] Assignee: Canon Kabushiki Kaisha, Tokyo, Japan

[21] Appl. No.: 807,504

[22] Filed: Dec. 11, 1985

[30] Foreign Application Priority Data

Dec. 12, 1984 [JP] Japan .................. 59-260792

[51] Int. Cl.[4] .................. H01S 3/19; H01L 31/12
[52] U.S. Cl. .................. 372/50; 357/19; 372/49
[58] Field of Search .................. 372/50, 49; 357/19

[56] References Cited

FOREIGN PATENT DOCUMENTS 0137686 12/1978 Japan .................. 372/50
0196085 11/1983 Japan .................. 372/50

Primary Examiner—William L. Sikes
Assistant Examiner—Georgia Y. Epps
Attorney, Agent, or Firm—Fitzpatrick, Cella, Harper & Scinto

[57] ABSTRACT

A semiconductor laser comprises a plurality of lasers provided in the form of an array, the lasers being monolithically formed, a plurality of photodetector elements being monolithically formed, a plurality of first separating portions for separating the lasers and the photodetector elements from each other, and at least one second separating portion for separating the plurality of lasers from one another and the plurality of photodetector elements from one another.

9 Claims, 2 Drawing Sheets

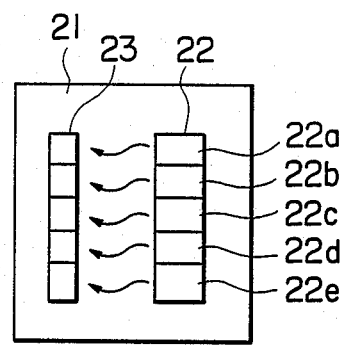
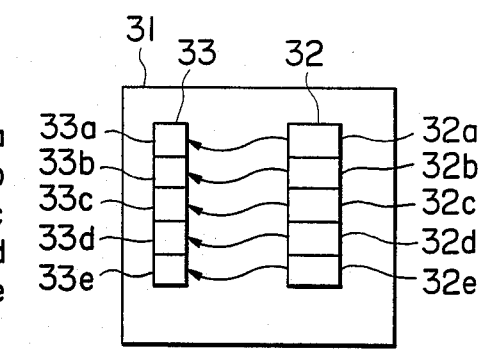
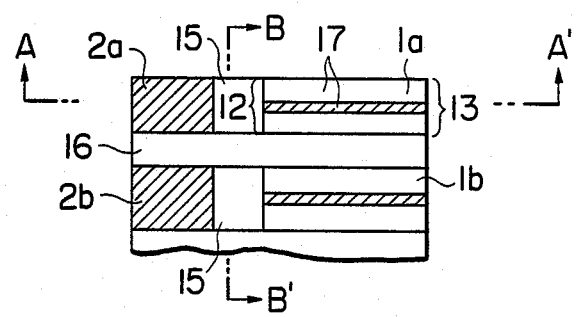
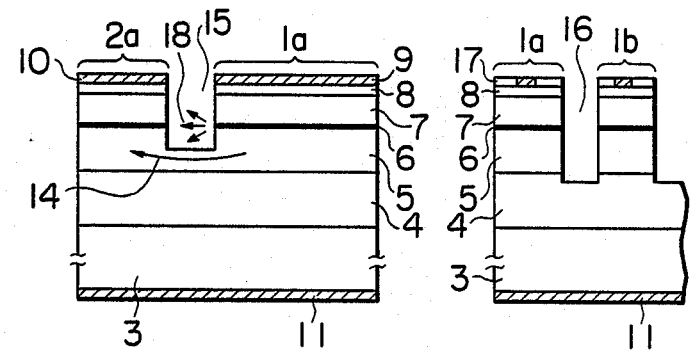

SEMICONDUCTOR LASER PROVIDED WITH A PLURALITY OF LASERS IN THE FORM OF AN ARRAY

BACKGROUND OF THE INVENTION

1. Field of the Invention

This invention relates to a semiconductor laser, and in particular to an array-like semiconductor laser (hereinafter referred to as the array laser) comprising two or more semiconductor lasers integrally provided on a substrate.

Heretofore, the array laser of this type has been arranged as shown, for example, in FIG. 1 of the accompanying drawings. In FIG. 1, reference numeral 21 designates a support member formed of a silicon substrate or a copper block. An array laser 22 and a photodetector element 23 are disposed on the support member 21 so as to comprise individual lasers 22a–22e. In this example of the arrangement, the lasers 22a, 22b, 22c, 22d and 22e are successively turned on and the light outputs thereof are received by the photodetector element 23 so that the intensities of currents introduced into the respective lasers 22a–22e are adjusted in accordance with the intensities of the lights therefrom.

In the example shown in FIG. 1, there is a photodetector element, but an array-like photodetector element (hereinafter referred to as a photodetector element array) can be used.

FIG. 2 of the accompanying drawings shows an example in which a photodetector element array 33 is employed. In this example, an array laser 32 and the photodetector element array 33 are disposed on a silicon substrate 31 so as to face each other. The array laser 32 is bonded onto the silicon substrate 31, and the outputs of lasers 32a–32e are inputted to the photodetector elements 33a–33e of the photodetector element array 33 monolithically formed on the substrate 31. In this case, the laser lights outputted from the active layers of the lasers 32a–32e pass through the space into the photodetector elements 33a–33e.

The above-described semiconductor lasers according to the prior art suffer from the following disadvantages:

(1) Particularly, in the example shown in FIG. 2, the outputs of the adjacent lasers other than the outputs of the corresponding lasers are also input to the respective photodetector elements and these produce noise. For example, as regards the light input to the photodetector element 33b, the output from the laser 32b is of course the largest, but the inputs from the lasers 32a and 32c are also substantial and accordingly, it is difficult to detect the inputs from the lasers 32a–32e by the photodetector elements 33a–33e without mutual interference.

(2) It is difficult to install the lasers of the array laser or the array laser on the substrate so as to exactly face the respective photo-detector elements of the photodetector element array or one photodetector element.

SUMMARY OF THE INVENTION

It is an object of the present invention to provide a semiconductor laser which eliminates the disadvantages noted above of the prior art.

The semiconductor laser according to the present invention overcomes the above-noted disadvantage (1) by providing separating portions (for example, physical grooves) for separating the laser portion and the photodetector portion from each other and providing separating portions (for example, physical grooves) for separating the lasers from one another and the photodetector elements from one another, and overcomes the above-noted disadvantage (2) by forming the lasers and the photodetector elements monolithically so that they face each other, whereby the above objective is achieved.

That is, the present invention comprises a semiconductor laser provided with a plurality of lasers in the form of an array, characterized in that a plurality of monolithically formed photodetector elements are provided corresponding to said lasers, and separating portions for separating the array laser and the photodetector element array from each other and separating portions for separating the lasers from one another and the photodetector elements from one another are provided.

BRIEF DESCRIPTION OF THE DRAWINGS

FIGS. 1 and 2 show examples of the arrangement of the semiconductor laser according to the prior art.

FIGS. 3A–3C show the construction of an embodiment of the semiconductor laser according to the present invention, FIG. 3A being a plan view, FIG. 3B being a front cross-sectional view taken along the line A—A' of FIG. 3A, and FIG. 3C being a side cross-sectional view taken along line B—B' of FIG. 3A.

DESCRIPTION OF THE PREFERRED EMBODIMENTS

Figure 4:
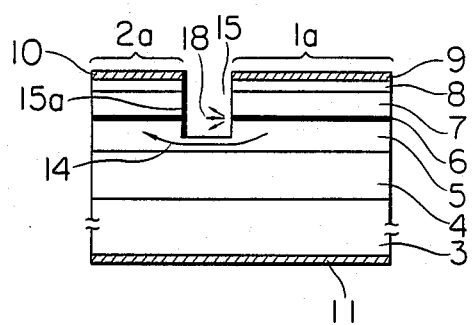
FIGS. 4 to 8 show modifications of the FIG. 3 embodiment.

Several embodiments of the present invention will hereinafter be described with reference to the drawings.

FIGS. 3A, 3B and 3C are a plan view, a front cross-sectional view and a side cross-sectional view, respectively, showing the construction of an embodiment of the semiconductor laser according to the present invention. Lasers 1a, 1b, ... and photodetector elements 2a, 2b, ... are monolithically formed on a common substrate 3 and, as shown in FIG. 3A, the lasers 1a, 1b, ... and the photodetector elements 2a, 2b, ... face each other exactly. Their exact position is possible because they are monolithically formed. That is, the photodetector elements for monitoring the laser outputs and the lasers correspond to each other in the relation of one to one. in FIGS. 3B and 3C, reference numeral 6 designates an active layer which is a portion which produces light. That is, the light produced in the active layer 6 by a current flowing between electrodes 9 and 11 resonates between surfaces 12 and 13 and is produced as a laser light. Reference numerals 5 and 7 denote clad layers which serve to confine the light produced in the active layer 6 in the vicinity thereof.

The leakage light from each laser 1a, 1b, ... passes through the clad layer 5 lying below a physical groove 15 which separates each laser 1a, 1b, ... and each photodetector element 2a, 2b, ... from each other, and enters each photodetector element 2a, 2b, ..., and is taken out as a photocurrent by a voltage being applied between electrodes 10 and 11 (this voltage is usually opposite in polarity to the voltage applied between electrodes 9 and 11). By adjusting the voltage applied between the electrodes 9 and 11 in accordance with the degree of that output, a proper laser light output can be stably obtained.

In order to prevent crosstalk between the lasers 1a, 1b, ... and between the lasers other than those which face the photodetector elements 2a 2b, ..., grooves 16 deeper than the groove 15 are provided so as to separate the lasers 1a, 1b, ... from one another and the photodetector elements 2a, 2b, ... from one another. Thus, for example, the light from the laser 1b does not enter the photodetector elements other than the photodetector element 2b. Layers 4 and 8 serve to effectively confine the current produced between the electrodes 9 and 11 between these layers 4 and 8.

A method of making the semiconductor laser according to the present embodiment will now be described with reference to FIGS. 3A-3C.

First, n type GaAs was used as the substrate 3. On this n type GaAs substrate 3, n type (Si dope) GaAs layer 4 of a thickness of about 2 $\mu$m, n type AlGaAs layer (clad layer) 5 of a thickness of 2 $\mu$m, non-dope GaAs layer (active layer) 6 of a thickness of 0.1 $\mu$m, p type (Be dope) AlGaAs layer (clad layer) 7 of a thickness of 2 $\mu$m and p type GaAs layer 8 of a thickness of 0.2 $\mu$m were successively grown by the molecular line epitaxy method.

On these grown films, grooves 16 having a depth of 5 $\mu$m and a width of 20 $\mu$m were formed at a pitch of 100 $\mu$m by the ion beam shower method which is a dry etching method. Subsequently, a groove 15 having a depth of 3 $\mu$m was formed by the same method.

Finally, current limiting areas 17 shown in FIG. 3A were formed so as to permit a current to flow into a part of the laser, whereafter electrodes 9, 10 and 11 were formed.

When the crosstalk (the percentage of the input from the lasers other than the facing lasers to the input from the facing laser) was measured with respect to this sample, a good result of 5% or less was obtained.

Also, as regards crosstalk, it may be the case that the light (designated by 18 for the sake of convenience) from each laser 1a, 1b, ... directly passes through the groove 15 and enters each photodetector element 2a, 2b, .... In order to positively prevent this, in a modification embodiment shown in FIGS. 3A through 3C, the inner wall of the groove 15 which is adjacent to the photodetector elements is coated with a film 15a of high reflectivity, such as a metal film or an insulative multilayer film (FIG. 4) to thereby reduce the propagation of the light 18 through the groove 15. Thus, the crosstalk can be improved to 2%.

Figure 5A:
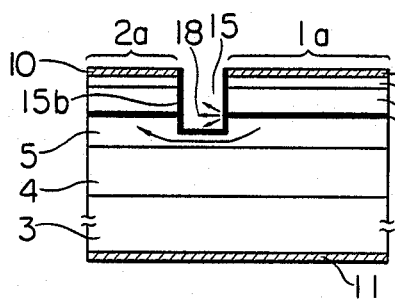
Figure 5B:
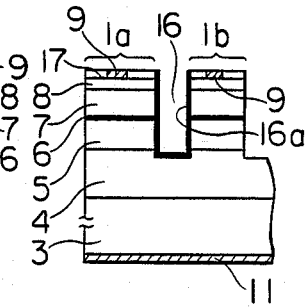
Figure 6A:
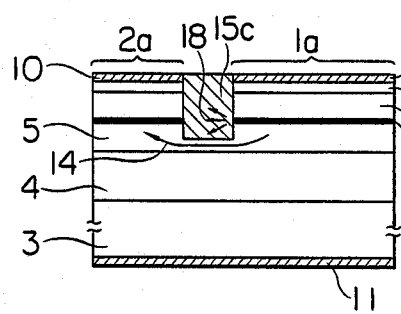
Figure 6B:
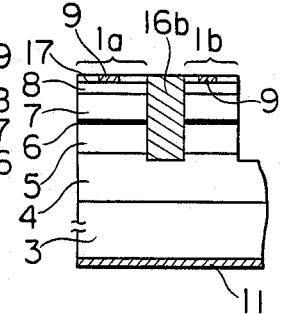

As in the present embodiment, the grooves 15 and 16 may be exposed to the air, but alternatively, they may be coated with films 15b and 16a of a material having a refractive index smaller than that of the material of the substrate 3 ( n type GaAs), such as SiO$_2$, Si$_3$N$_4$ or AlGaAs having a great Al content (FIGS. 5A and 5B). As a further alternative, the grooves 15 and 16 may be completely filled with these materials 15c and 16b. (FIGS. 6A and 6B).

Figure 7:
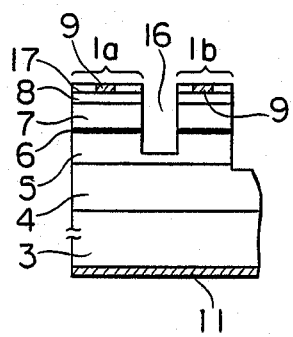

Also, the groove 16 may terminate in the clad layer as shown in FIG. 7, but if it is engraved into the layer 4 as shown in FIG. 3C, it will more effectively prevent crosstalk.

Further, if the groove 15 is too great in width, the light 14 will be absorbed to too great an extent by the layer 4 and therefore, the width of the groove 15 is preferably be 10 $\mu$m or less. In the present embodiment, the width of the groove 15 is 3 $\mu$m.

Figure 8:
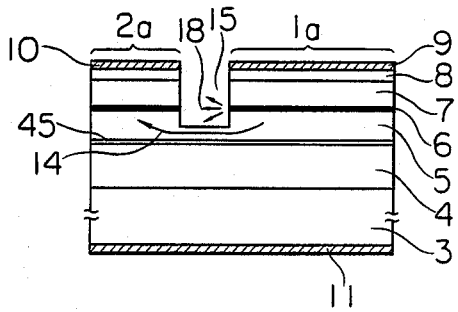

However, where a layer 45, smaller in refractive index than the layers 4 and 5 (for example, a layer of AlGaAs having a great Al content,) is provided between the layer 4 and the layer 5 (FIG. 8), the width of the groove 15 is not limited to 10 $\mu$m.

According to the present invention, as described above, the lasers and the photodetector elements are monolithically formed so that they correspond to each other, and the separating portions for separating the laser portion and the photodetector portion from each other and the separating portions for separating the lasers from one another and the photodetector elements from one another are provided to thereby enable a part of the output of the corresponding lasers to be introduced into the photodetector elements by an appropriate amount without crosstalk and thus stably enable the output of the array laser to be made proper (for example, to be unified).

We claim:

1. A semiconductor laser device comprising:
    a plurality of lasers provided in the form of an array, said lasers being monolithically formed on a substrate, said substrate including electrodes and a resonant cavity;
    a plurality of photodetector elements corresponding to said plurality of lasers, said photodetector elements being monolithically formed;
    a plurality of first separating portions for separating said lasers and said photodetector elements from each other, each of said first separating portions being a groove in said device between each of said lasers and said photodetector elements corresponding thereto; and
    at least one second separating portion for separating said plurality of lasers from one another and said plurality of photodetector elements from one another, said second separating portion being a groove in said device between said lasers and between said photodetector elements, and wherein said groove of said second separating portion is deeper than said grooves of said first separating portion.

2. A semiconductor laser device according to claim 1, wherein the inner walls of the grooves of said first separating portions which are adjacent to said photodetector elements are coated with films of high reflectivity, respectively.

3. A semiconductor laser device according to claim 1, wherein each of said plurality of lasers includes a substrate and an active layer interposed between two clad layers provided on said substrate.

4. A semiconductor laser device according to claim 3, wherein each of the grooves of said first and second separating portions is coated with a film of a material smaller in refractive index than the material of said substrate.

5. A semiconductor laser device according to claim 3, wherein the depth of the grooves of said first separating portions is of such a degree that the grooves terminate in said clad layer nearer to said substrate.

6. A semiconductor laser device according to claim 3, wherein the depth of the groove of said second separating portion is of such a degree that the groove extends through said clad layer nearer to said substrate.

7. A semiconductor laser device according to claim 5, wherein the width of the grooves of said first separating portions is 10 $\mu$m or less.

8. A semiconductor laser device according to claim 5, wherein a layer smaller in refractive index than the material of said clad layer is formed on a surface of said clad layer nearer to said substrate.

9. A semiconductor laser device according to claim 1, wherein each of said plurality of lasers include a substrate and an active layer interposed between two clad layers provided on said substrate, and said first and second separating portions are grooves filled with a material smaller in refractive index than the material of said substrate.

* * * * *

UNITED STATES PATENT AND TRADEMARK OFFICE
CERTIFICATE OF CORRECTION

PATENT NO. : 4,794,609

DATED : December 27, 1988

INVENTOR(S) : TOSHITAMI HARA, ET AL.

It is certified that error appears in the above-identified patent and that said Letters Patent is hereby corrected as shown below:

COLUMN 1

Lines 12-13, --2. Description of the Related Art-- should be inserted.
    Line 56, "photo-detector" should read --photodetector--.

COLUMN 2

Line 45, "in" should read --In--.

COLUMN 3

Line 40, "(FIG. 4)" should read --(FIG. 4),--.
    Line 51, "clad layer" should read --clad layer 5--.
    Line 58, "be" should be deleted.

Signed and Sealed this

Twenty-fourth Day of October, 1989

Attest:

DONALD J. QUIGG

*Attesting Officer*       *Commissioner of Patents and Trademarks*